United States Patent [19]

Habiro et al.

[11] Patent Number: 5,065,088
[45] Date of Patent: Nov. 12, 1991

[54] CURRENT SENSOR CIRCUIT

[75] Inventors: Tetsuo Habiro; Takeo Kashiwa, both of Kanagawa, Japan

[73] Assignee: Toyo Communication Equipment Co., Ltd., Kanagawa, Japan

[21] Appl. No.: 476,422

[22] PCT Filed: Sep. 22, 1989

[86] PCT No.: PCT/JP89/00968
§ 371 Date: Jun. 26, 1990
§ 102(e) Date: Jun. 26, 1990

[87] PCT Pub. No.: WO90/03581
PCT Pub. Date: Apr. 5, 1990

[30] Foreign Application Priority Data

Sep. 22, 1988 [JP] Japan ................. 63-238135

[51] Int. Cl.⁵ .............. G01R 33/06; H04B 3/46
[52] U.S. Cl. .................. 324/117 H; 379/378
[58] Field of Search .......... 324/117 H, 251, 127, 324/130; 307/309; 379/378, 382

[56] References Cited

U.S. PATENT DOCUMENTS 4,020,294 4/1977 Kitajewski et al. ........... 324/117 H
4,022,980 5/1977 Kitajewski et al. ............... 324/378

Primary Examiner—Ernest F. Karlsen
Attorney, Agent, or Firm—Spensley Horn Jubas & Lubitz

[57] ABSTRACT

A current sensor circuit for measuring by means of a Hall element the magnitude of a magnetic flux obtained in response to an input electric current and for generating a signal corresponding to the result of measurement, wherein a Hall element (2) is driven by a voltage obtained by a voltage follower-type voltage generating unit (4) whose output voltage changes by following a supply voltage, and the voltage obtained by the voltage generating unit is applied as an offset compensating voltage, thereby simplifying the circuit of a Hall element portion. In addition, a forward threshold voltage and a reverse threshold voltage that are used in a forward comparator unit (6) and a reverse comparator unit (8), respectively, are separately generated by a first reference resistor unit (5) and a second reference resistor unit (7), thereby simplifying an adjustment operation at a comparator portion and improving the comparator accuracy.

1 Claim, 3 Drawing Sheets

CURRENT SENSOR CIRCUIT

TECHNICAL FIELD

The present invention relates to a current sensor circuit using a Hall element.

BACKGROUND ART

In a network control unit (NCU) of a communication line used in facsimile equipment (hereinafter referred to as FAX), a modulator-demodulator (hereinafter referred to as the modem), or the like, the presence or absence of a loop current of the line is usually detected by the use of a current sensor circuit, and line control processing or the like is effected on the basis of the result of this detection.

In addition, in not only such FAX and modems but also other types of apparatus using a telephone line adopting, for instance, an LP (loop signaling) system for transmission and receipt of a signal by the opening or closing of a DC loop circuit, a current sensor circuit is provided for the purposes of effecting call processing and cut-off processing with respect to terminal equipment by turning on and off of a DC loop current and for the purposes of effecting call-responding and terminating processing with respect to an exchange by means of the polarity of the loop current.

In this case, as a current sensor circuit, one using a reed relay or one using a photodiode are conventionally used; however, the former type has the problem that reliability is low, while the latter type has the problem that trouble occurs due to a change with time.

Accordingly, for the purpose of preventing the occurrence of such problems, current sensor circuits using a magnetic sensor such as a Hall element are frequently used.

FIG. 2 is a circuit diagram illustrating an example of such a magnetic sensor-type current sensor circuit.

The current sensor circuit shown in this diagram comprises a coil 101 for generating a magnetic flux of a magnitude and a direction that correspond to a value and direction of an input current; a Hall element unit 102 for producing a Hall voltage of a value corresponding to the magnitude and direction of the magnetic flux thus generated by the coil; a drive voltage generating unit 109 for supplying a source voltage to the Hall element unit 102; an inverter/amplifier unit 103 for amplifying the Hall voltage output from the Hall element unit 102; and a compensation voltage generating unit 104 for generating a compensation voltage necessary for effecting offset compensation for the inverter/amplifier unit 103 and unbalance compensation for the Hall element unit 102.

The current sensor circuit further comprises a threshold voltage generating unit 105 for generating a forward threshold voltage and a reverse threshold voltage; a forward comparator unit 106 for generating a "1" signal of a negative logic when the Hall voltage output from the inverter/amplifier unit 103 is higher than a positive-side threshold voltage output from the threshold voltage generating unit 105; and a reverse comparator unit 107 for generating a "1" signal of the negative logic when the Hall voltage output from the inverter/amplifier unit 103 is lower than the reverse threshold voltage output from the threshold voltage generating unit 105.

When a current flows through an electric line in which the coil 101 is inserted, and a magnetic flux of a magnitude corresponding to the value and direction of the aforementioned current is output from the coil 101, the Hall element unit 102 detects the same and generates a Hall voltage of a value corresponding to the value and direction of that magnetic flux. At the same time, the Hall voltage is amplified by the inverter/amplifier unit 103, and a "1" signal of the negative logic is output from the forward comparator unit 106 when the voltage obtained by the amplifying action is higher than the forward threshold voltage. In addition, when the voltage obtained by the amplifying action is lower than the reverse threshold voltage, a "1" signal of the negative logic is output from the reverse comparator unit 107.

In addition to such a current sensor circuit, a circuit which is shown in FIG. 3, for example, is also known. In this drawing, the components that are identical with those shown in FIG. 2 are denoted by the same reference numerals.

The current sensor circuit shown in this drawing is provided with a constant-voltage generating unit 110 instead of the drive voltage generating unit 109 shown in FIG. 2, and a constant voltage is supplied from this constant voltage generating unit 110 to the Hall element unit 102.

However, the following drawbacks have been experienced with these conventional current sensor circuits.

First, with the current sensor circuit shown in FIG. 2, since the drive voltage generating unit 109 is constituted by a resistor 111, although there is the advantage that the circuit can be simplified, when the internal resistance of a Hall element 112 constituting the Hall element unit 102 has changed owing to a change in the temperature of the Hall element 112, the applied voltage also changes correspondingly, causing the value of the Hall voltage to change.

In addition, the current sensor circuit shown in FIG. 3, since the constant voltage generating unit 110 is constituted by a transistor 113 for voltage control and resistors 114, 115 for determining a bias voltage for the transistor 113, it is possible to maintain the voltage applied to the Hall element 112 at a constant level even when the internal resistance of the Hall element 112 has changed owing to a temperature change of the Hall element 112. However, there have been problems in that it is difficult to effect a reduction in cost by a portion in which the number of parts used increases, and that this arrangement is disadvantageous in terms of space.

Furthermore, with the current sensor circuits shown in FIGS. 2 and 3, three resistors 116, 117, 118 are connected in series to constitute the threshold voltage generating unit 105, so that it is impossible to make adjustment of either one of the forward threshold voltage and the reverse threshold voltage output from the threshold voltage generating unit 105. Hence, there has been the drawback that the adjustment operation is difficult.

The present invention has been devised in view of the above-described situation, and its object is to provide a current sensor circuit which allows a reduction in the cost of the circuit and space saving to be effected by reducing the number of parts used, and which is capable of increasing the accuracy of the circuit and simplifying adjustment.

DISCLOSURE OF THE INVENTION

In a current sensor circuit in accordance with the present invention, the driving of, and unbalance compensation for, a Hall element is effected by a voltage obtained by one voltage generating unit, and offset compensation is effected for an inverter/amplifier unit by means of the aforementioned voltage, thereby simplifying the circuit of a Hall element portion. In addition, a forward threshold voltage and a reverse threshold voltage that are used in a forward comparator unit and a reverse comparator unit are separately generated by a first reference resistor unit and a second reference resistor unit, thereby facilitating an adjustment operation at a comparator portion and improving the comparator accuracy.

BEST MODE FOR CARRYING OUT THE INVENTION

Figure 1:
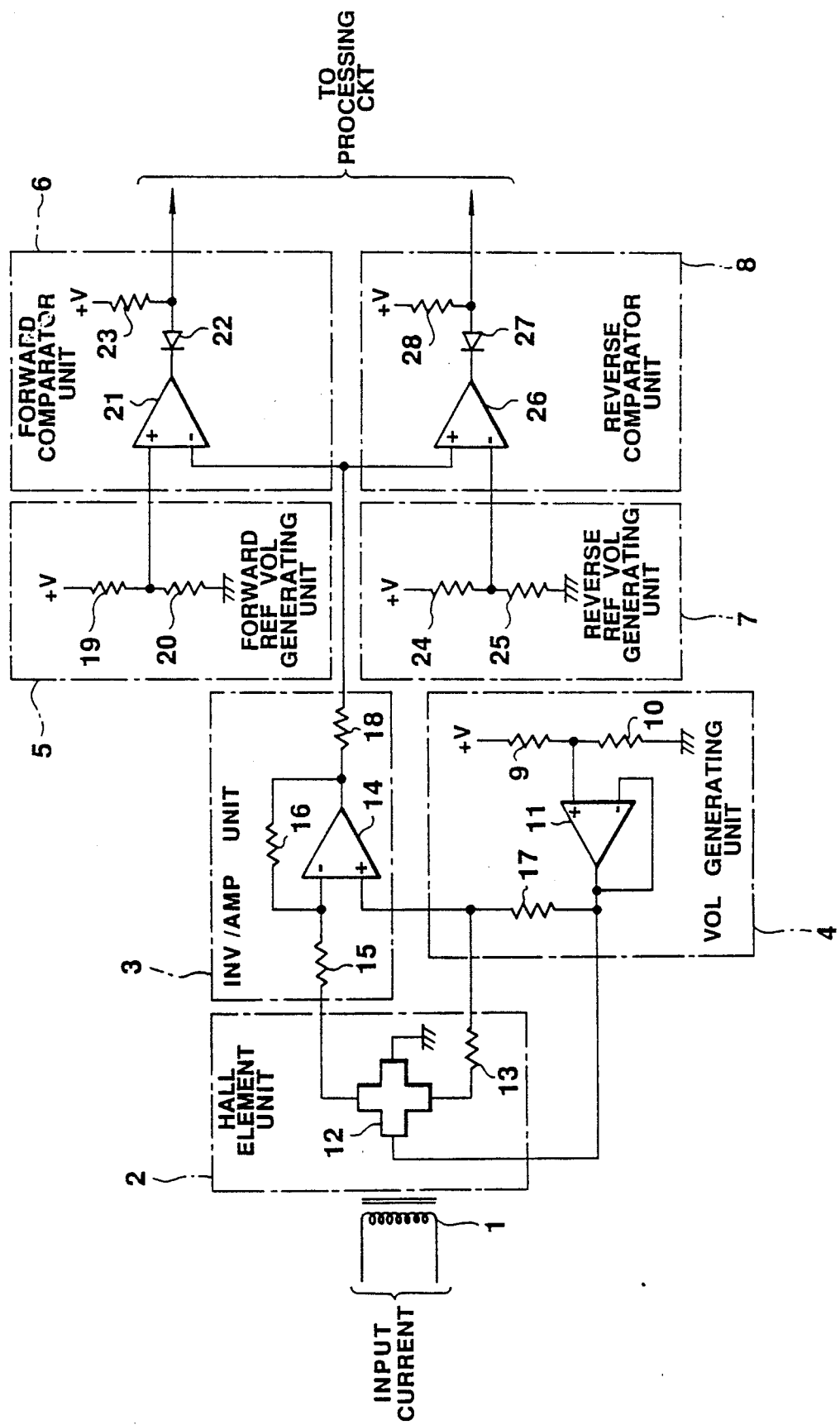
FIG. 1 is a circuit diagram illustrating an embodiment of a current sensor circuit in accordance with the present invention.
Figure 2:
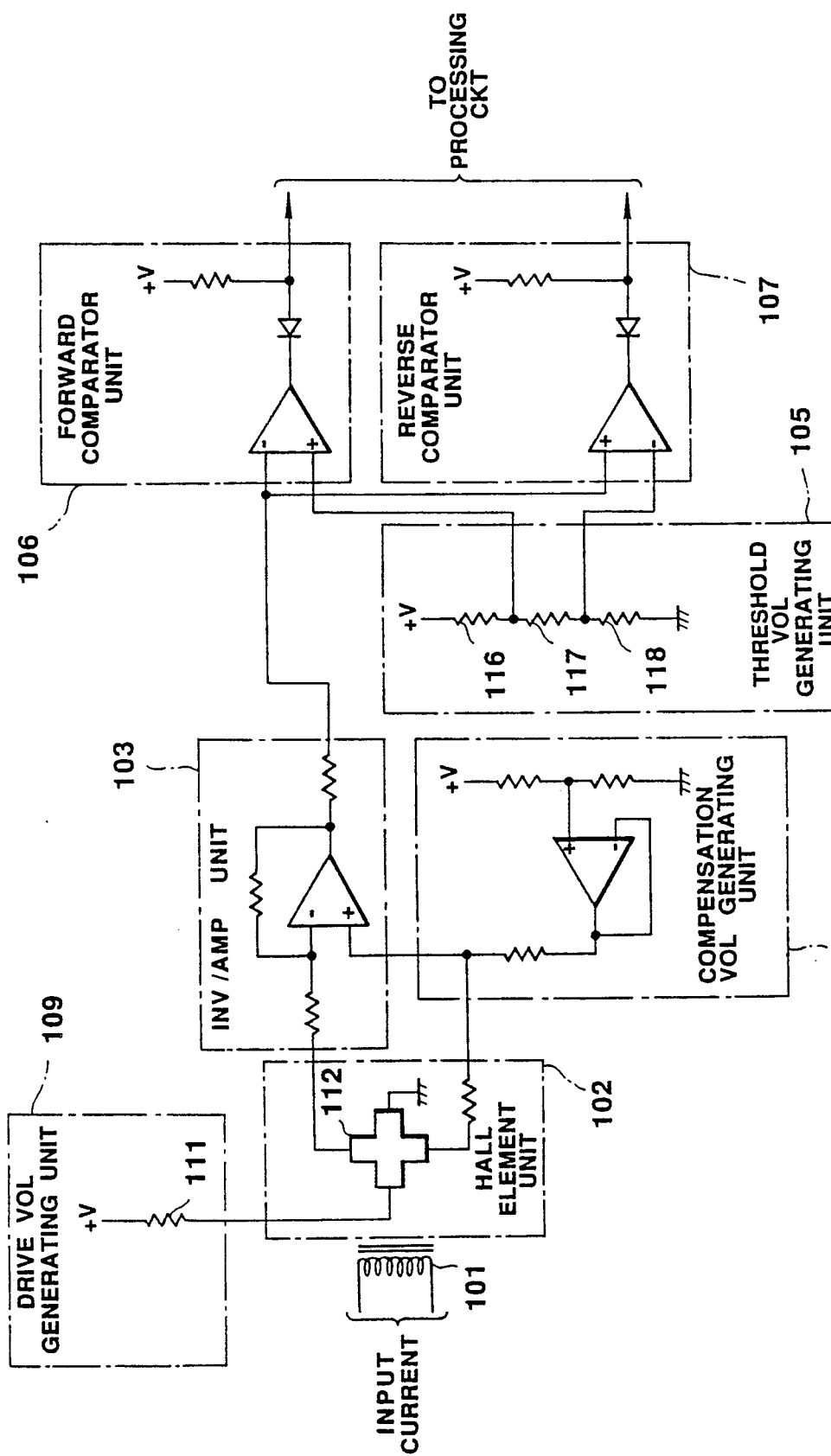
FIG. 2 is a circuit diagram illustrating an example of a conventionally known current sensor circuit.
Figure 3:
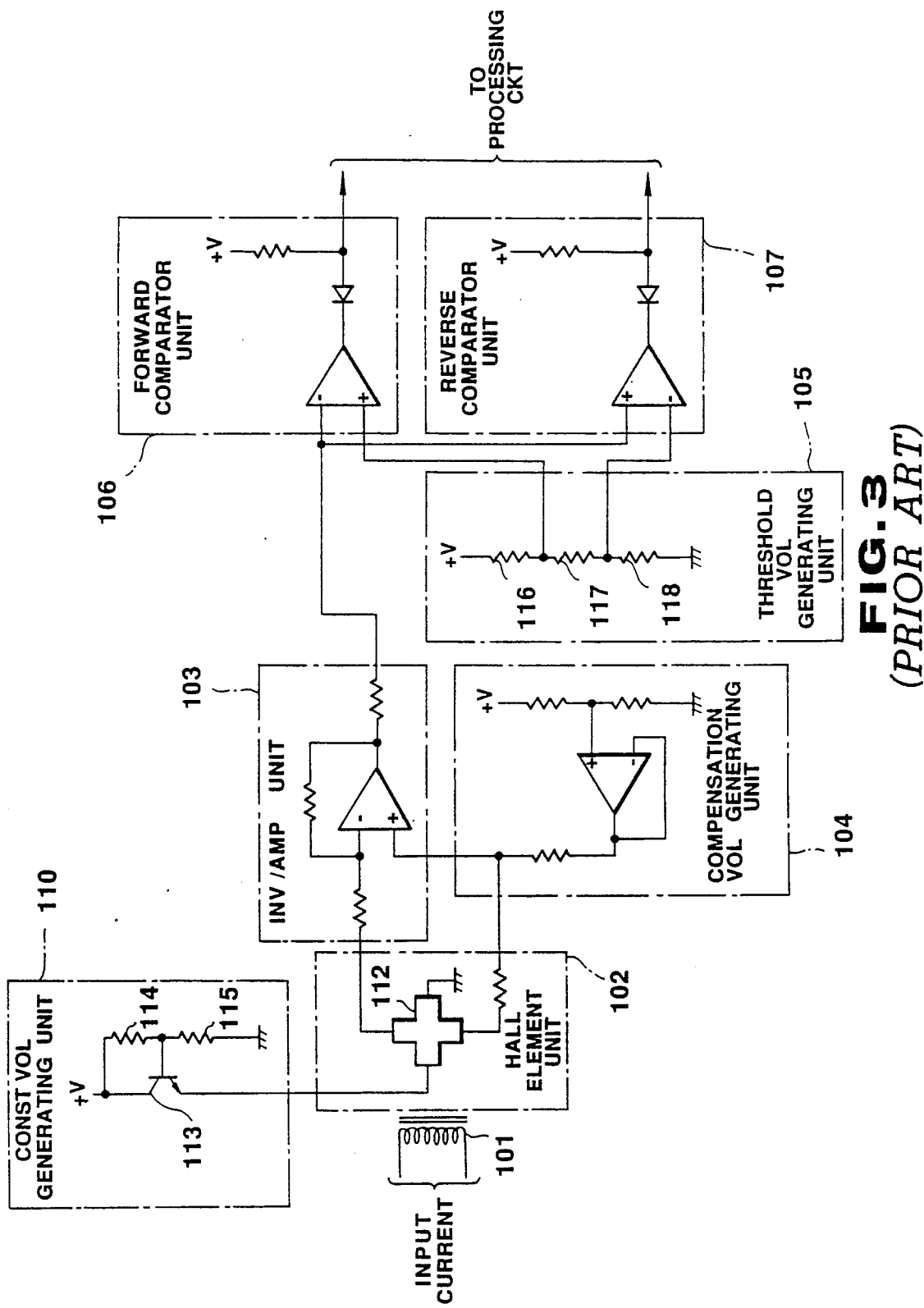
FIG. 3 is a circuit diagram illustrating another example of a conventionally known current sensor circuit.

FIG. 1 is a circuit diagram illustrating an embodiment of a current sensor circuit in accordance with the present invention.

The current sensor circuit shown in this diagram comprises a coil 1 for generating a magnetic flux of a magnitude and a direction corresponding to a value and direction of an input current; a Hall element unit 2 for generating a Hall voltage corresponding to the magnitude and direction of the magnetic flux produced by the coil 1; an inverter/amplifier unit 3 for amplifying the Hall voltage output from the Hall element unit 2; and a voltage generating unit 4 for generating a voltage necessary for effecting offset compensation for the inverter/amplifier unit 3 and the driving of, and unbalance compensation for, the Hall element unit 2.

The current sensor circuit further comprises a forward reference voltage generating unit 5 for generating a forward threshold voltage; a forward comparator unit 6 for generating a "1" signal of a negative logic when the Hall voltage output from the inverter/amplifier unit 3 is higher than a forward threshold voltage output from the forward reference voltage generating unit 5; a reverse reference voltage generating unit 7 for generating a reverse threshold voltage; and a reverse comparator unit 8 for generating a "1" signal of the negative logic when the Hall voltage output from the inverter/amplifier unit 3 is lower than the reverse threshold voltage output from the reverse reference voltage generating unit 7.

The coil 1 is inserted in an electric line which is an object whose current is to be detected, and when a current flows through this electric line, the coil 1 produces a magnetic flux of a magnitude and a direction that correspond to the magnitude and direction of that current.

The voltage generating unit 4 has two resistors 9, 10 for determining a reference voltage value, an operational amplifier 11 for receiving the reference voltage value determined by the values of these resistors 9, 10, and a resistor 17 for transmitting an output voltage of this operational amplifier 11 to the Hall element unit 2 and the inverter/amplifier unit 3. The voltage generating unit 4 generates a reference voltage by causing the operational amplifier 11 to follow the reference voltage obtained by the resistors 9, 10, supplies the same directly to a power input terminal of the Hall element unit 2, and at the same time supplies the same to a compensation terminal of the Hall element unit 2 and the inverter/amplifier unit 3 via the resistor 17.

The Hall element unit 2 has a Hall element 12 which is magnetically connected to the aforementioned coil 1, as well as a resistor 13 for compensating an unbalanced voltage of the Hall element 12. When the reference voltage is supplied thereto from the voltage generating unit 4 via the power input terminal, the Hall element 12 is driven by this reference voltage at a constant voltage, and the unbalanced voltage of the Hall element 12 is compensated by means of the reference voltage input via the compensation terminal and the resistor 13. In this state, when the coil 1 generates a magnetic flux, the Hall element 12 generates a Hall voltage corresponding to the magnitude and direction of the magnetic flux, and supplies the same to the inverter/amplifier unit 3.

The inverter/amplifier unit 3 has an operational amplifier 14 for effecting an amplifying operation, a resistor 15 serving as an input resistor for the operational amplifier 14, a resistor 16 serving as a feedback resistor for the operational amplifier 14, and a resistor 18 for transmitting an output of the operational amplifier 14 to a following-stage circuit, and an offset voltage of the operational amplifier 14 is compensated by the reference voltage supplied from the voltage generating unit 4. In addition, when the Hall voltage is supplied thereto from the Hall element unit 2, the inverter/amplifier unit 3 inverts and amplifies the same to generate an output voltage (Hall voltage), and supplies the output voltage to the forward comparator unit 6 and the reverse comparator unit 8.

The forward reference voltage generating unit 5 has resistors 19, 20 for determining a forward threshold voltage, and supplies the forward threshold voltage obtained from the resistors 19, 20 to the forward comparator unit 6.

The forward comparator unit 6 has an operational amplifier 21 for comparing the value of the forward threshold voltage and the value of the Hall voltage output from the inverter/amplifier unit 3, a diode 22 which is made conductive when the output terminal of the operational amplifier 21 assumes a low voltage, and a resistor 23 for pulling up an anode of the diode 22. When the value of the Hall voltage output from the inverter/amplifier unit 3 is higher than the value of the forward threshold voltage, the voltage at the output terminal of the operational amplifier 21 is set to a low level. As a result, the diode 22 is made conductive, thereby allowing a "1" signal of the negative logic to be generated and supplied to a following-stage processing circuit (not illustrated).

The reverse reference voltage generating unit 7 has resistors 24, 25 for determining a reverse threshold voltage, and supplies the reverse threshold voltage obtained from these resistors 24, 25 to the reverse comparator unit 8.

In the same way as the forward comparator unit 6, the reverse comparator unit 8 has an operational amplifier 26, a diode 27, and a resistor 28 for pulling-up. When the value of the Hall voltage output from the inverter/amplifier unit 3 is lower than the value of the reverse threshold voltage, the voltage at the output terminal of the operational amplifier 26 is set to a low level to make the diode 27 conductive, with the result that a "1" signal of the negative logic is generated and supplied to the aforementioned processing circuit.

Thus, in this embodiment, since the constant-voltage driving of the Hall element 12, the compensation of the unbalance of the Hall element 12, and the compensation of the offset of the operational amplifier 14 are effected by means of the reference voltage generated by the voltage generating unit 4, it is possible to reduce the number of parts used as compared with a conventional current sensor circuit. In consequence, it is possible to attain a cost reduction, high precision, and space saving of the circuit.

In addition, since in the above-described embodiment the forward reference voltage generating unit 5 and the reverse reference voltage generating unit 7 are formed independently, it is possible to make adjustment individually for the forward threshold voltage and the reverse threshold voltage, with the result that it is possible to effect high precision of the circuit and facilitate adjustment.

INDUSTRIAL APPLICABILITY

The current sensor circuit in accordance with the present invention is employed for detecting the presence or absence of a loop current in a communication line used for facsimile equipment, modems, and the like, and effects control and processing of the line on the basis of the result of detection.

We claim:
1. A current sensor circuit for measuring by means of a Hall element the magnitude of a magnetic flux obtained in response to an input electric current and for generating a signal corresponding to a result of measurement, characterized by comprising:
 a voltage follower-type voltage generating unit whose output voltage changes by following a supply voltage;
 a Hall element driven by a voltage obtained from said voltage generating unit;
 an amplifier unit to which the voltage obtained from said voltage generating unit is applied as an offset compensating voltage, and which is adapted to amplify an output voltage of said Hall element;
 a first reference resistor unit for generating a positive-side threshold voltage;
 a first comparator unit for generating a signal when a value of an output voltage output from said amplifier unit is greater toward a positive side than the positive side threshold voltage;
 a second reference resistor unit for generating a negative side threshold voltage; and
 a second comparator unit for generating a signal when the value of the output voltage output from said amplifier unit is greater toward a negative side than the negative side threshold voltage.

* * * * *